(12) United States Patent
Wall, Jr. et al.

(10) Patent No.: US 7,638,814 B2
(45) Date of Patent: Dec. 29, 2009

(54) SOLDERLESS INTEGRATED PACKAGE CONNECTOR AND HEAT SINK FOR LED

(75) Inventors: Franklin Wall, Jr., Vacaville, CA (US);
Peter Stormberg, Stolberg, DE (US);
Jeffrey Kmetec, Palo Alto, CA (US);
Mina Farr, Palo Alto, CA (US); Li Zhang, San Jose, CA (US)

(73) Assignee: Philips Lumileds Lighting Company, LLC, Eindhoven (NL)

( * ) Notice: Subject to any disclaimer, the term of this patent is extended or adjusted under 35 U.S.C. 154(b) by 240 days.

(21) Appl. No.: 11/765,291

(22) Filed: Jun. 19, 2007

(65) Prior Publication Data

US 2008/0315214 A1 Dec. 25, 2008

(51) Int. Cl.
*H01L 23/34* (2006.01)
(52) U.S. Cl. .......................... 257/99; 257/81; 257/100; 257/116; 257/433; 257/678; 257/718; 257/720; 257/726; 257/727; 257/E23.083; 257/E23.084; 257/E23.086
(58) Field of Classification Search ................ 257/718, 257/720, 726, 727, 81, 82, 91, 99, 100, 116, 257/117, 432–437, 749, E33.056–E33.059, 257/E25.032, 678–733, E23.001–E23.193
See application file for complete search history.

(56) References Cited

U.S. PATENT DOCUMENTS

| | | | | |
|---|---|---|---|---|
| 4,731,693 | A | * 3/1988 | Berg et al. | ................... 361/719 |
| 6,441,943 | B1 | 8/2002 | Roberts et al. | |
| 2005/0269589 | A1 | 12/2005 | Wu | |
| 2006/0082315 | A1 | 4/2006 | Chan | |
| 2006/0198147 | A1 | 9/2006 | Ge | |

FOREIGN PATENT DOCUMENTS

| | | |
|---|---|---|
| EP | 1496551 A2 | 1/2005 |
| EP | 1544924 A2 | 6/2005 |
| JP | 2003218397 A | 7/2003 |

* cited by examiner

*Primary Examiner*—Jasmine J Clark

(57) ABSTRACT

Standard solderless connectors extend from a molded package body supporting at least one high power LED. The package includes a relatively large metal slug extending completely through the package. The LED is mounted over the top surface of the metal slug with an electrically insulating ceramic submount in-between the LED and metal slug. Electrodes on the submount are connected to the package connectors. Solderless clamping means, such as screw openings, are provided on the package for firmly clamping the package on a thermally conductive mounting board. The slug in the package thermally contacts the board to sink heat away from the LED. Fiducial structures (e.g., holes) in the package precisely position the package on corresponding fiducial structures on the board. Other packages are described that do not use a molded body.

18 Claims, 13 Drawing Sheets

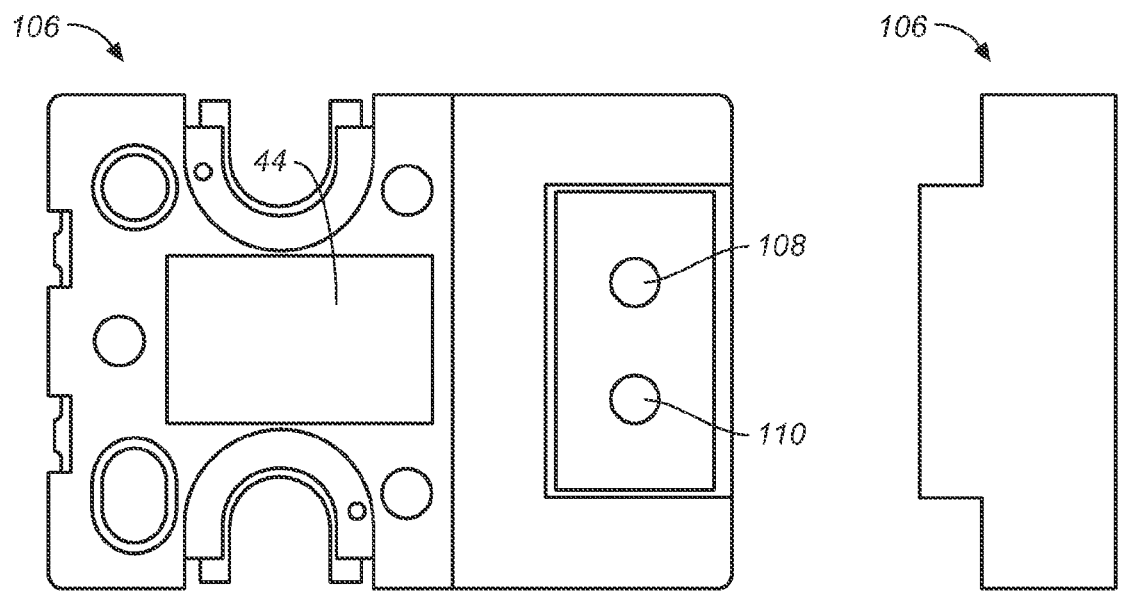
FIG. 17  FIG. 18
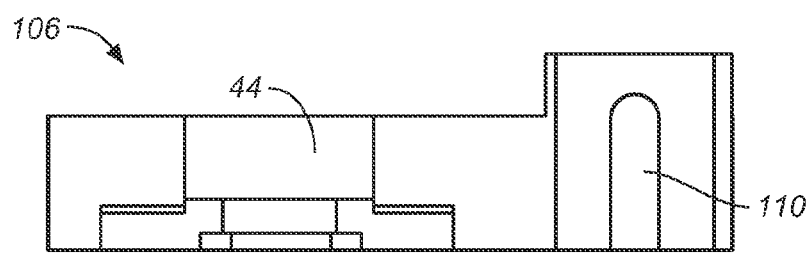
FIG. 19

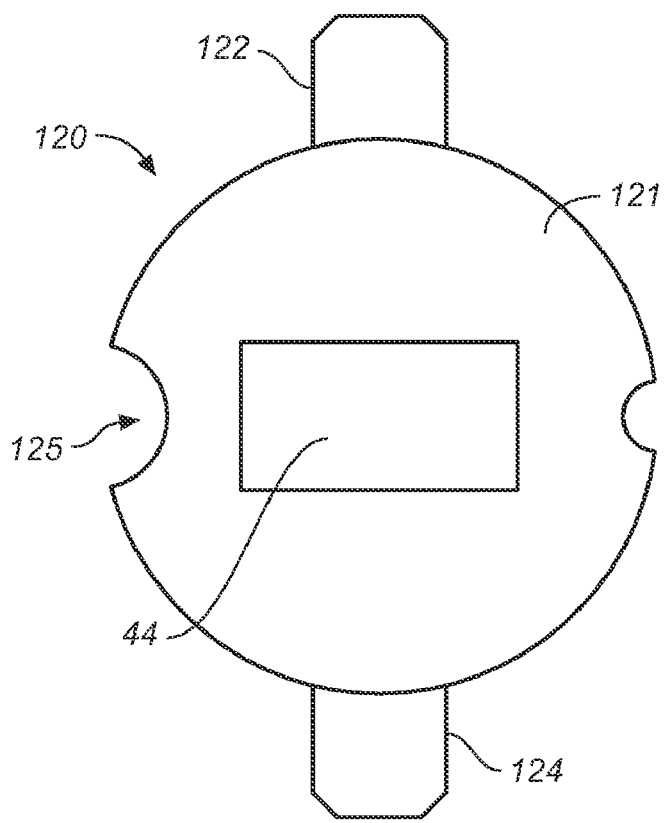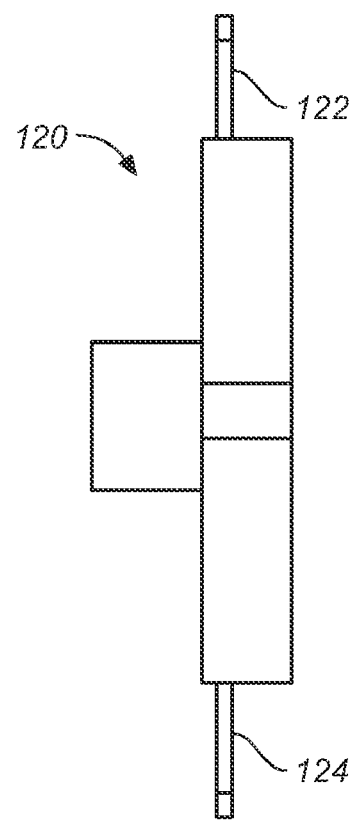
FIG. 23  FIG. 24
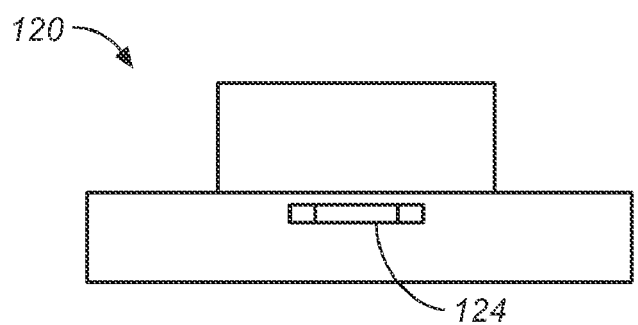
FIG. 25

SOLDERLESS INTEGRATED PACKAGE CONNECTOR AND HEAT SINK FOR LED

FIELD OF THE INVENTION

This invention relates to packaged light emitting diodes (LEDs) and, in particular, to an LED package that provides heat sinking of the LED to an external heat sink and uses a standard solderless connector for power.

BACKGROUND

High power LEDs used for illumination generate much heat that needs to be sinked to an external heat sink. Typically, a packaged LED, such as shown in prior art FIG. 1, includes an LED die 10, a ceramic submount 12 with electrodes bonded to the LED die electrodes, a metal heat conductor slug 14, a reflective cavity 16, solderable surface mount leads 18 connected to the submount electrodes for soldering to a printed circuit board (PCB), a molded plastic body 20, and a lens 22 glued to the body.

The PCB (not shown) may have a metal body with an electrically insulating surface over which metal traces are formed. The metal traces may interconnect multiple LED packages, and the metal leads typically terminate in connectors at the edge of the PCB for attachment to power supply leads. The metal slug 14 conducts heat from the LED to the PCB body, which is then air cooled.

It is conventional to solder the package leads to a circuit board to firmly secure the package to the heat sinking PCB. Providing the package with solderable leads also allows the LED package to be treated as an integrated circuit package, so conventional IC mounting and soldering techniques can be used when mounting LED packages onto PCBs. Essentially, the high power LED package evolved from the high power IC package design.

As a consequence of the solderable connections, the equipment manufacturers that purchase and mount high power LED packages must invest in soldering technologies, such as solder bath systems or equipment that solders the connections individually. Different manufacturers have different competencies for soldering LED packages to PCBs, making it difficult for some manufacturers to handle high power LED packages.

Further, accurately positioning the package on the PCB is difficult in that the package may be slightly out of position over the PCB pads yet still be adequately soldered onto the PCB pads. Thus, the light source will not be precisely located with respect to the PCB.

What is needed is a package for high power, high heat generating LEDs that simplifies the electrical connection to a power supply and provides excellent heat sinking of the LED without the use of solder.

SUMMARY

Various LED packages are described herein that enable an equipment manufacturer handling the packaged LEDs to use only standard solderless connectors for the electrical connection to the package and use simple clamping techniques for mounting the package on a heat-sinking mounting board. The embodiments also enable precise positioning of the LED package on the mounting board. The embodiments also enable a customized lens to be easily secured to the package without an adhesive.

In one embodiment, standard male spade lugs for the anode and cathode electrodes of the LED package rigidly extend from a molded plastic body. This enables the manufacturer to simply provide female spade connectors at the ends of wires for coupling power to the LED. The female connectors are easily slipped over the male connectors. The package includes a relatively large metal slug extending completely through the package. The LED is mounted over the top surface of the metal slug with an electrically insulating ceramic submount in-between the LED and metal slug. Electrodes on the top of the submount are connected to the male spade lugs. Solderless clamping means, such as screw openings, are provided on the package for securely clamping the package to a heat sink or a heat-sinking board, both referred to herein as board. The board may or may not be a PCB. The slug in the package thermally contacts the board to sink heat away from the LED. Fiducial structures (e.g., holes) in the package precisely position the package on corresponding fiducial structures on the board.

Since the connectors on the package mate with standard commercially available connectors, any manufacturer using the packages can easily connect and mount packages with no investment in soldering systems. The packages are positioned to a more precise tolerance than typical surface mount packages, and the thermal coupling to the heat sinking board is improved since the clamping presses the package down on the board.

Recesses and guides are provided on the package for receiving a unitary construction lens. The lens may be completely formed of a molded transparent plastic with fiducial pins that are inserted into fiducial holes in the package for exact positioning of the lens. The lens has resilient clamping arms that clamp to the recesses in the package for firmly securing the lens to the package with no adhesive.

In another embodiment, the body is a flat metal piece (e.g., Cu) and the slug (e.g., CuW) is welded to the center area of the metal body. The slug in combination with the metal body conducts heat from the LED to the mounting board. A small printed circuit board is affixed to the metal body. The submount electrodes and the package solderless terminals are electrically connected via the printed circuit board. The package terminals are mechanically supported by the printed circuit board.

Many other standard electrical connectors are described for use in the package, including pin connectors and screw down connectors that clamp a bare wire with screws.

BRIEF DESCRIPTION OF THE DRAWINGS

FIGS. 17, 18, and 19 are a front view, first side view, and second side view, respectively, of an LED package in accordance with a sixth embodiment of the invention.

FIGS. 23, 24, and 25 are a front view, first side view, and second side view, respectively, of an LED package in accordance with an eighth embodiment of the invention.

Elements identified by the same numeral in the various figures are the same or similar.

DETAILED DESCRIPTION

Figures 2, 3:
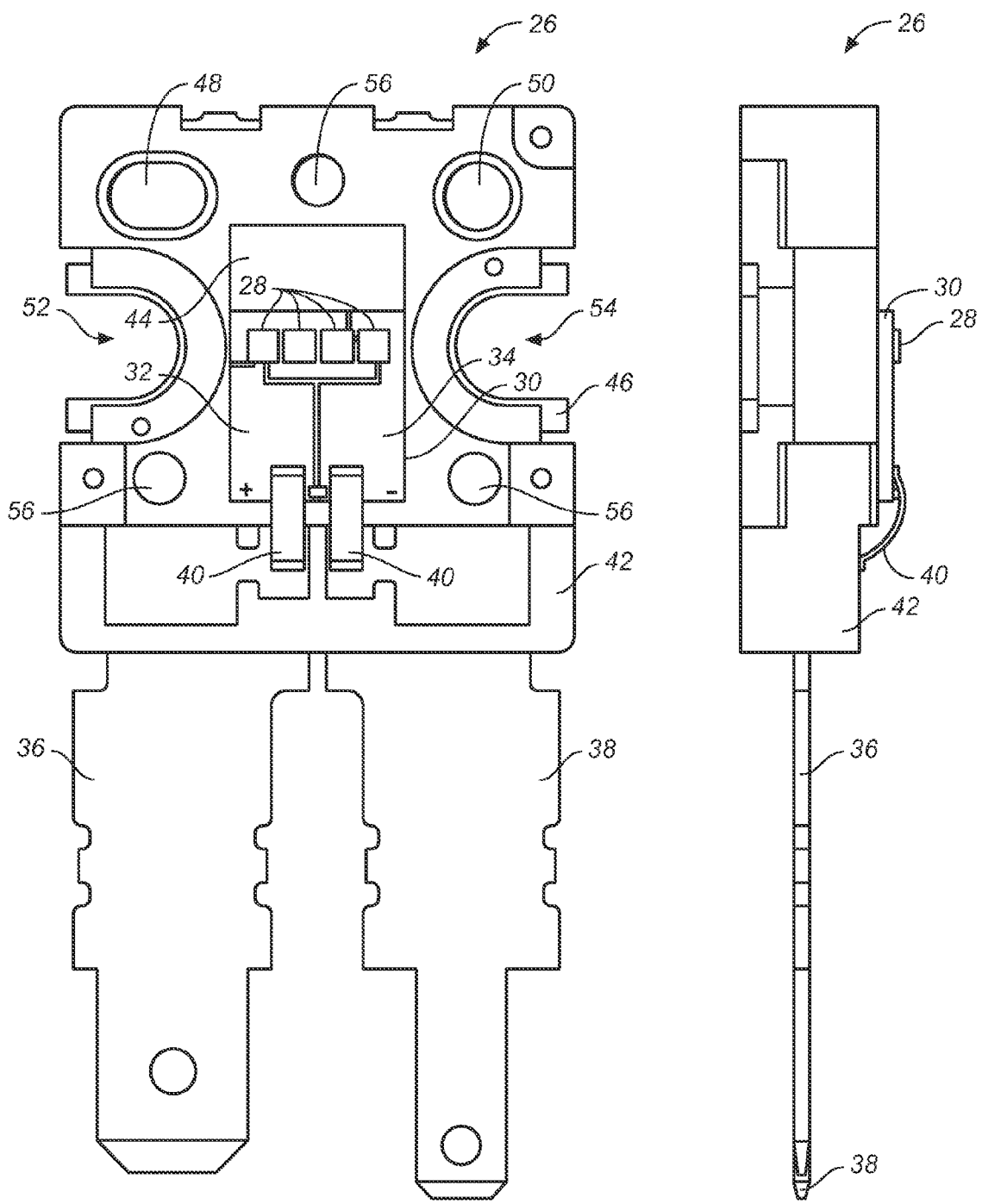
FIG. 2 is a front view of one embodiment of an LED package using standard solderless connectors in accordance with one embodiment of the invention.
FIG. 3 is a side view of the package of FIG. 2.

FIG. 2 is a front view of an LED package 26 containing LED dies 28. In the example, four separate LED dies 28 are electrically interconnected to achieve a desired light output at a specified input current; however, any number of LED dies may be interconnected in the same package.

In one embodiment, each LED die 28 is a GaN based LED emitting blue light. A thin plate of YAG phosphor over each die emits yellow-green light when energized by the blue light. The combination of the yellow-green light and the blue light leaking through produces white light. Any other type of high power LED may be used, and any other color may be generated. Suitable LEDs are available from Philips Lumileds Lighting Company.

Figures 4, 5:
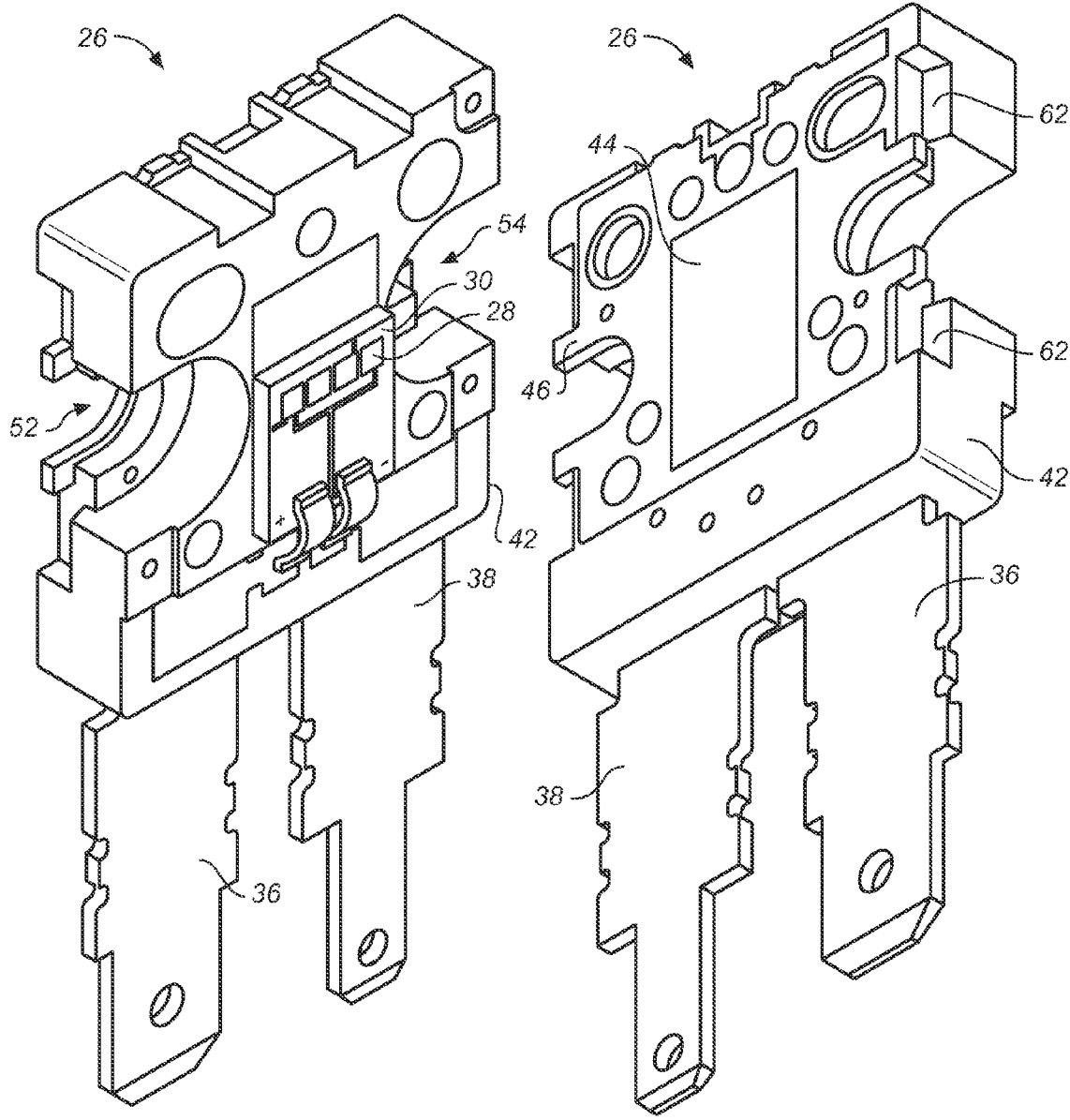
FIG. 4 is a front perspective view of the package of FIG. 2.
FIG. 5 is a rear perspective view of the package of FIG. 2.

The LED dies 28 are mounted on a submount 30, better viewed in FIGS. 3 and 4. The submount 30 interconnects the LED dies 28 with a metal trace layer, provides relatively large and robust cathode and anode electrode pads for connection to leads of the package, provides any additional circuitry (e.g., an ESD device), and eases handling. The submount 30 may be insulated aluminum, ceramic, insulated silicon, or any other suitable material that is thermally conductive yet electrically insulating. The LED dies 28 are flip chips with both electrodes on the bottom surface, so no wire bonding is needed for connection to the submount electrodes. The bottom electrodes of the LED dies 28 are either soldered to the submount electrodes or thermosonically welded using well known techniques. Flip chip LEDs and submounts are well known and are more fully described in U.S. Pat. Nos. 6,844,571 and 6,828,596, assigned to the present assignee and incorporated herein by reference.

The submount 30 has a top metal layer forming a large anode pad 32 and a large cathode pad 34. The pads 32 and 34 are bonded by metal ribbons 40 to the ends of respective male spade terminals 36 and 38 extending from the package. The bonding of ribbons 40 is typically by thermosonic welding, but may be by solder, wire bonding, or any other means. The spade terminals 36 and 38 are standardized terminals commonly used for many electrical applications. Wide and narrow spade terminals are used to ensure the correct polarity connection to the power supply. The equipment manufacturer employing the LED package 26 pushes corresponding female connectors (or lugs) over the spade terminals 36 and 38 for supplying power to the LEDs. Such female connectors are available from Tyco Electronics and many other manufacturers.

The package body 42 is formed of any moldable material, preferably a plastic, where the spade terminals 36 and 38 are rigidly molded into the body. In one embodiment, the molding material is a liquid crystal polymer for providing a low coefficient of thermal expansion and enabling high temperature processing and operation.

Also molded in body 42 is a metal slug 44, such as formed of copper-tungsten (CuW), Cu, or other suitably conductive material, that extends completely through the molded body 42. The slug 44 has features (shown in FIG. 7B) that cause it to be firmly held within the body 42. The top surface and bottom surface of the slug 44 is preferably rectangular to generally match the submount 30 and to maximize its surface area when thermally coupled to a mounting board. The slug may instead be circular, hexagonal, or other shapes.

The bottom surface of the submount 30 is metallized, and the submount 30 is soldered to the top surface of the slug 44 for maximum thermal coupling.

A metal (e.g., copper) plate 46 (FIG. 5) is optionally molded into the bottom surface of the body 42 to provide added strength to the body.

Figure 1:
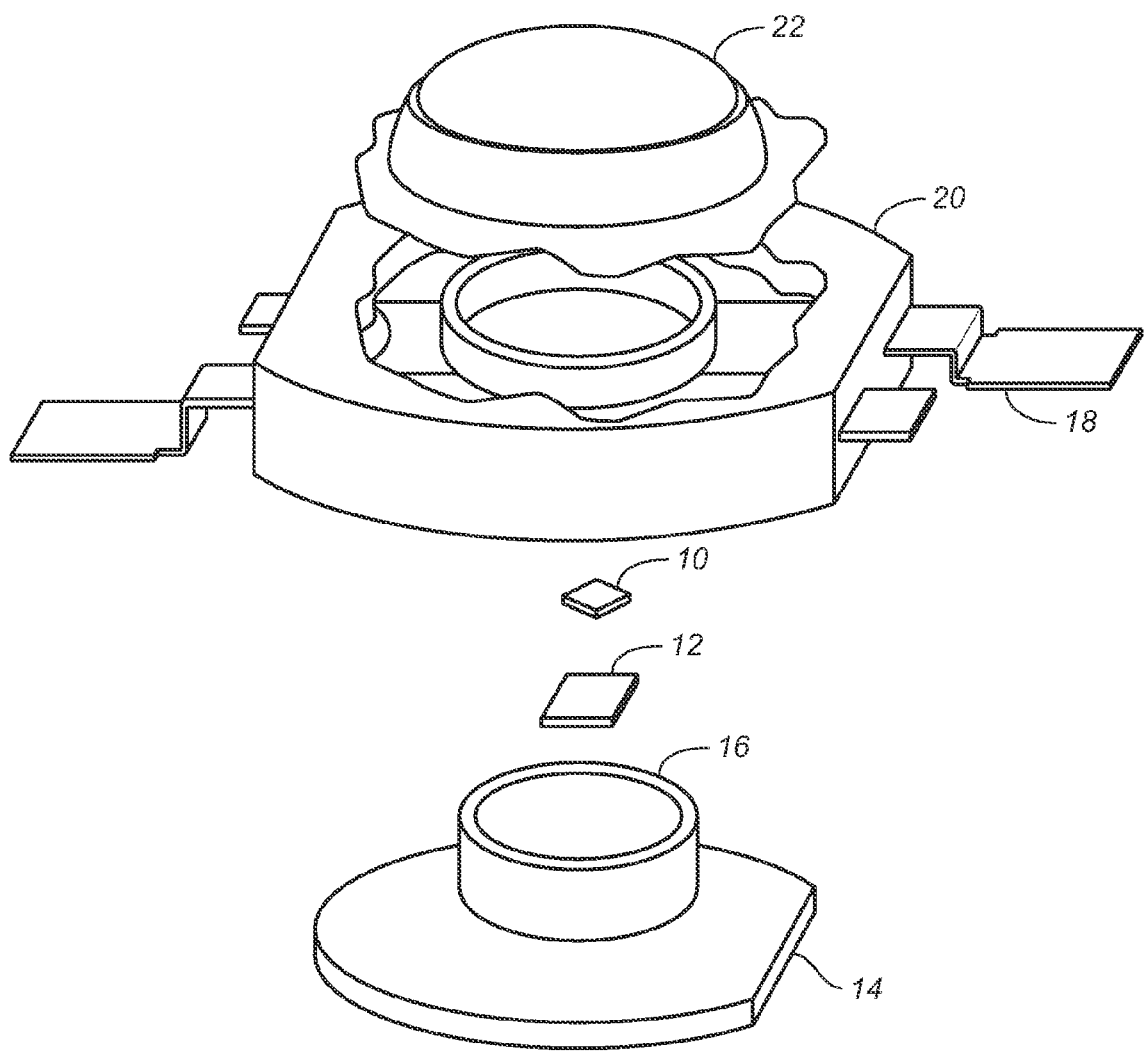
FIG. 1 is an exploded view of a prior art LED package.

Differently shaped fiducial holes 48 and 50 (FIG. 1) are provided through the body 42 for engaging corresponding guide pins on the mounting board. This causes the package to be precisely positioned on the board in the correct orientation before being firmly clamped to the board with screws. The guide pins, when inserted into the holes 48, also prevent rotation of the package when the screws are rotated to clamp the package to the mounting board, thereby ensuring accurate orientation of the LEDs.

Molded screw openings 52 and 54 are provided with ledges (best shown in FIG. 4) so the heads of screws push down on the ledges to firmly clamp the package to the board.

Figure 6:
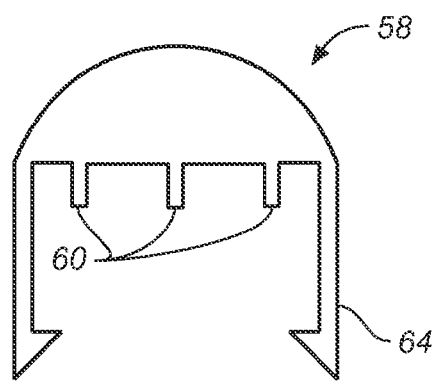
FIG. 6 is a side view of a unitary construction lens that snaps over the top of the package of FIG. 2.

Fiducial holes 56 on top of the package 26 are for positioning a lens 58 (FIG. 6) over the LEDs for shaping the beam in any manner determined by the lens shape. The lens 58 has pins 60 that firmly fit into holes 56 (FIG. 2) for precise alignment of the lens 58 over the LEDs. The package body 42 has indents 62 (FIG. 5) that are snap-latched into by resilient tabs 64 on the lens 58 when the lens is pushed onto the package after the package is mounted to the board.

Figure 7A:
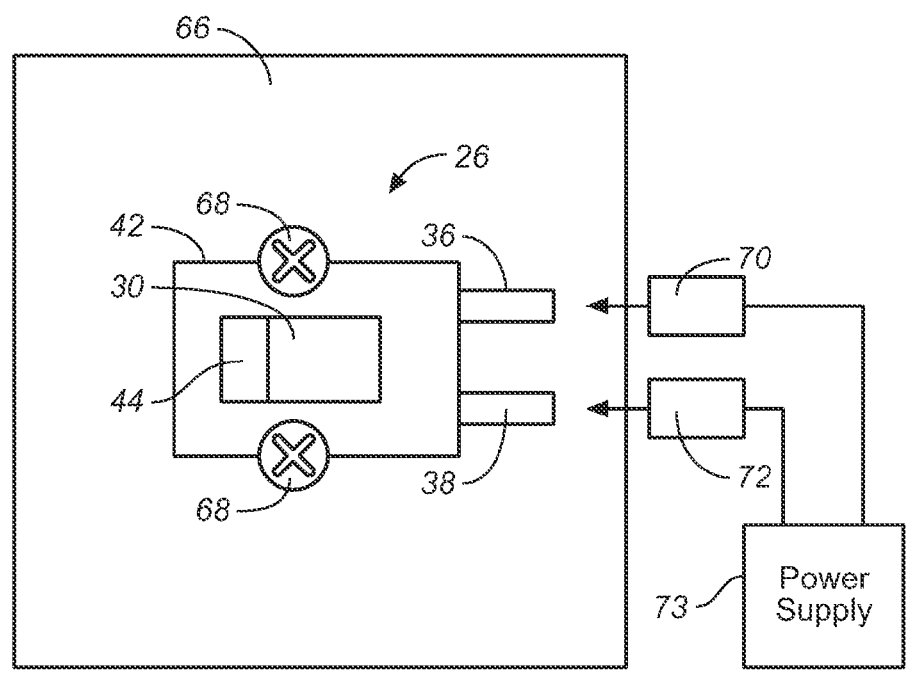
FIG. 7A is front view of a board on which the LED package is mounted (creating a module) along with connectors coupled to a power supply.

As shown in FIG. 7A, the package 26 is positioned onto a mounting board 66 with screws 68. In one embodiment, the board 66 has a metal core (e.g., aluminum) for conducting heat away from the slug 44 and for receiving the screws. In one embodiment, the exposed slug 44 extends a nominal 25 microns beyond the bottom surface of the plastic body to ensure firm thermal contact between the slug 44 and the board. The tolerance for the slug extension may be plus or minus 25 microns. In another embodiment, a malleable thermally conductive material (e.g., a metal paste) is deposited on the board beneath the package 26 to ensure firm thermal contact between the slug 44 and the board.

Nuts for the screws may be provided on the back of the board 66, or the screw threads may be formed directly in the board 66. In another embodiment, the package 26 is clamped to the board 66 using other than screws, such as spring clips, rivets, or other latching or affixing mechanisms.

Figure 7B:
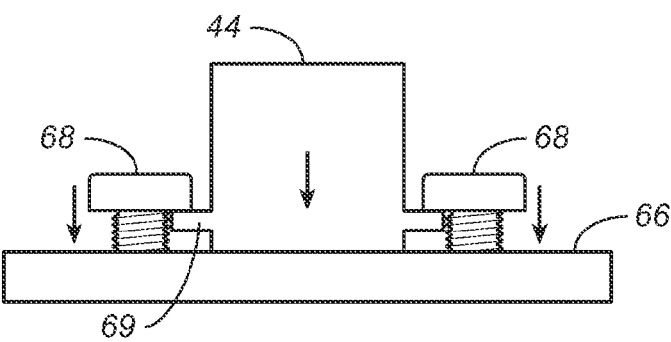
FIG. 7B is a partial cross-section through the two screws in FIG. 7A illustrating the slug in solid outline.

FIG. 7B is a partial cross-sectional view showing how the slug 44 has shelves 69 (or tabs) that extend out from two sides.

The molded body 42 (FIG. 7A) is not shown for simplicity. The shelves 69 firmly secure the slug 44 in the molded body 42 and also get pressed down by the screws 68 to ensure firm thermal contact between the slug 44 and the mounting board 66.

The board 66 may have an electrically insulating layer on its surface and support many more components. Metal traces (not shown) on the board 66 may interconnect various electrical components.

Once the package 26 has been secured to the board 66, lugs 70 and 72 are connected to the spade terminals 36 and 38, and the optional lens 58 (FIG. 6) is attached. FIG. 7A shows the lugs 70 and 72 connected to a power supply 73. Multiple packages may be connected in series and parallel.

As shown, the package 26 provides a high reliability electrical connection to a power supply without solder, and heat from the LEDs is efficiently coupled to an external heat sink via the slug 44. The package may be used for the highest power LEDs envisioned due to the reliable thermal coupling to the board.

Figure 8:
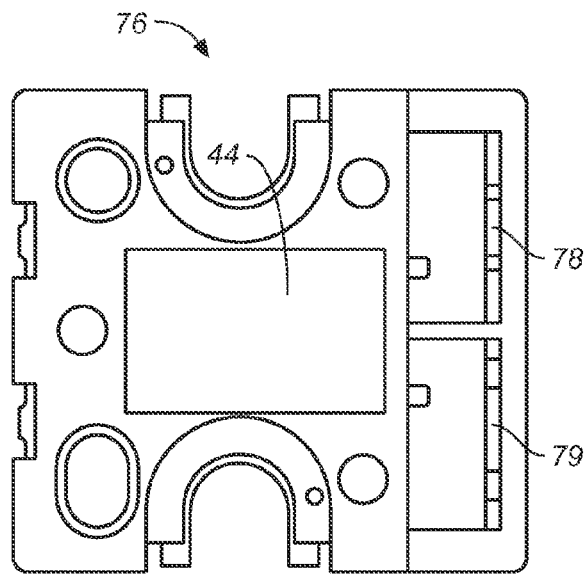
FIGS. 8, 9, and 10 are a front view, first side view, and second side view, respectively, of an LED package in accordance with a second embodiment of the invention.
Figure 9:
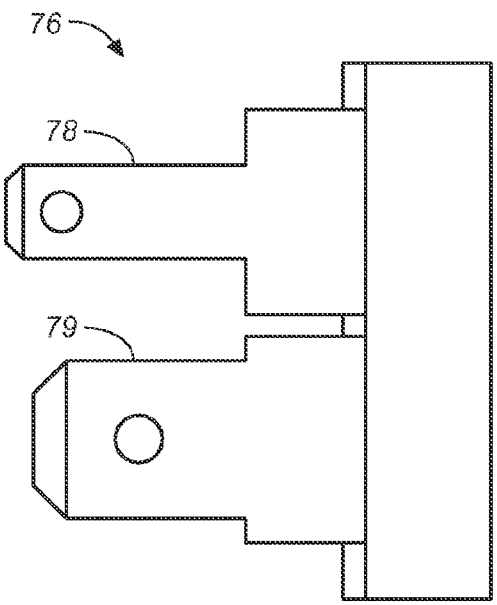
Figure 10:
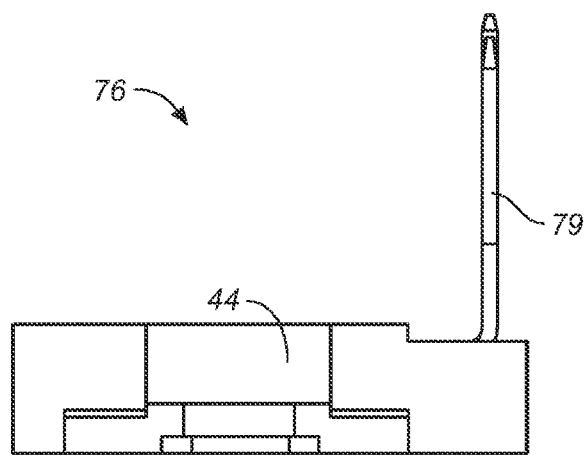

FIGS. 8-10 are different views of an LED package 76 identical to the package 26 of FIGS. 2-5 except that the spade terminals 78 and 79 are perpendicular to the package top surface. This reduces the space needed by the package on the board and reduces stress when pushing the lugs onto the terminals.

Figure 11:
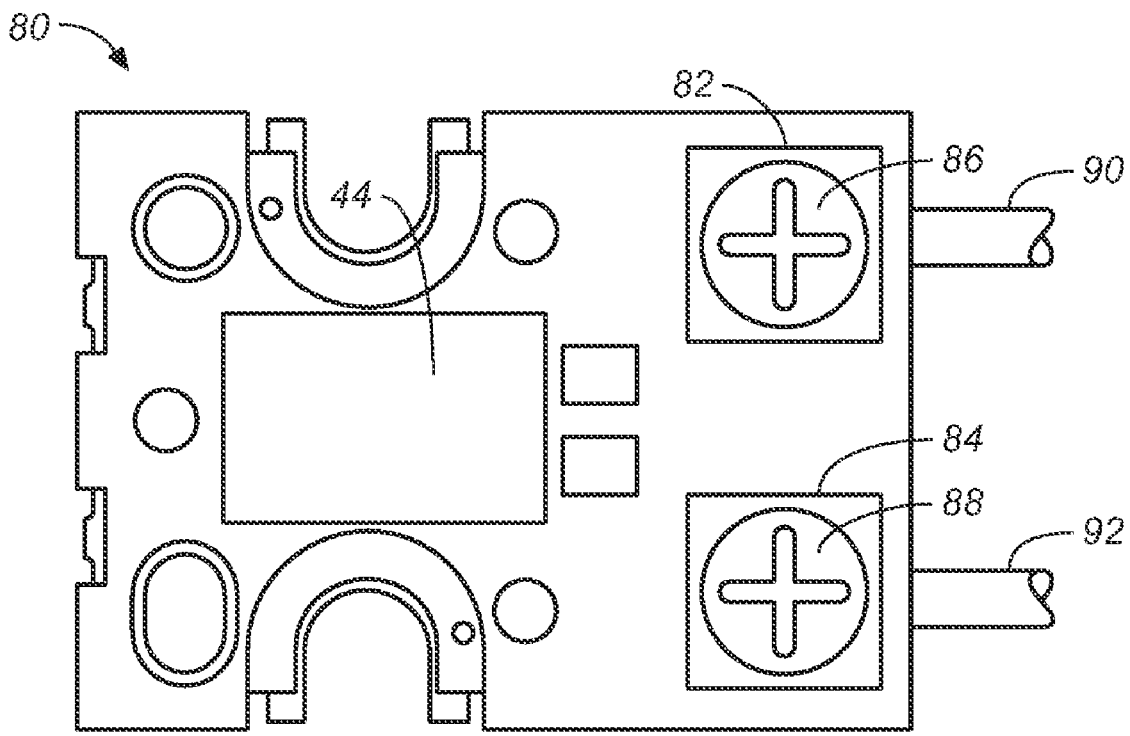
FIGS. 11 and 12 are a front view and side view, respectively, of an LED package in accordance with a third embodiment of the invention.
Figure 12:
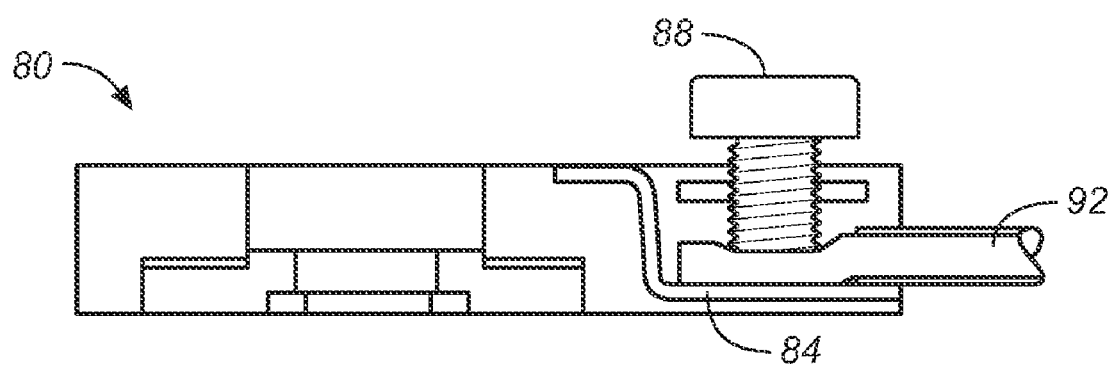

FIGS. 11 and 12 are different views of an LED package 80 identical to the package 26 of FIGS. 2-5 except that the terminals 82 and 84 are wire clamp terminals, where screws 86/88 clamp onto wires 90/92.

Figure 13:
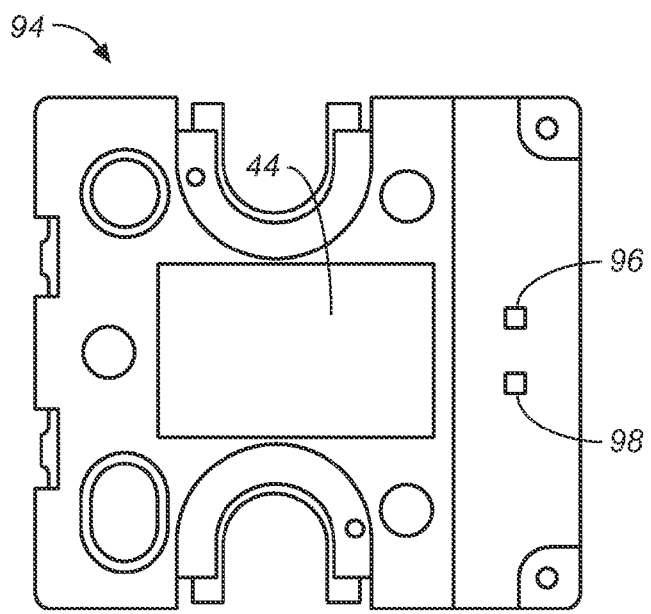
FIGS. 13 and 14 are a front view and side view, respectively, of an LED package in accordance with a fourth embodiment of the invention.
Figure 14:
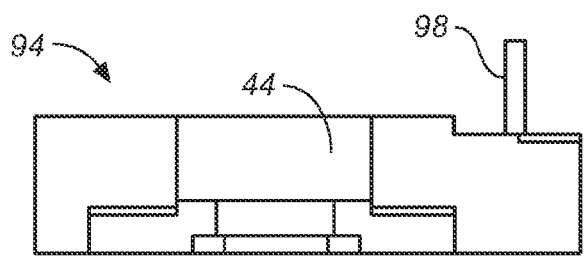

FIGS. 13 and 14 are different views of an LED package 94 identical to the package 26 of FIGS. 2-5 except that the terminals 96 and 98 are pins extending perpendicular to the package top surface. Connectors for receiving the pins 96 and 98 are standardized and available from Tyco Electronics.

Figure 15:
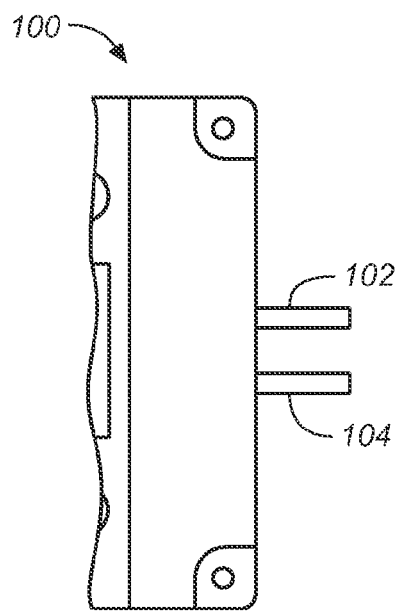
FIGS. 15 and 16 are a partial front view and partial side view, respectively, of an LED package in accordance with a fifth embodiment of the invention.
Figure 16:
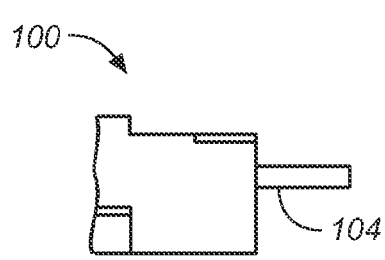

FIGS. 15 and 16 are different partial views of an LED package 100 identical to the package 94 of FIGS. 13 and 14 except that the terminals 102 and 104 are pins extending from a side and parallel to the package top surface.

FIGS. 17-19 are different views of an LED package 106 identical to the package 94 of FIGS. 13 and 14 except that the terminals 108 and 110 are pins set lower in the package to reduce the height of the package and protect the pins.

Figure 20:
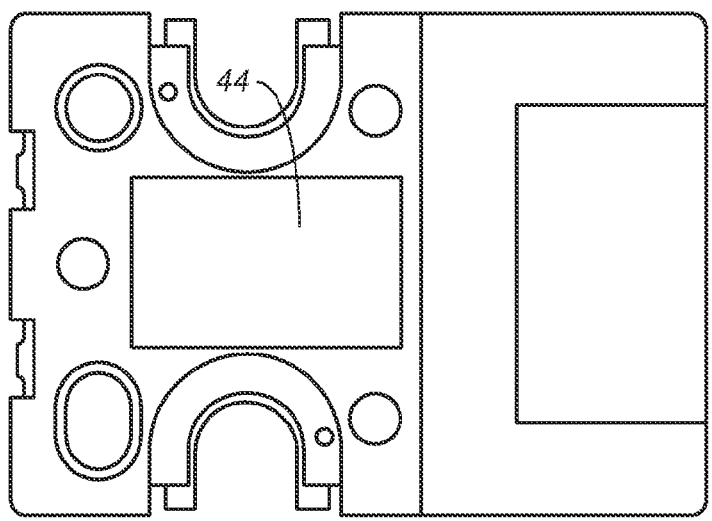
FIGS. 20, 21, and 22 are a front view, first side view, and second side view, respectively, of an LED package in accordance with a seventh embodiment of the invention.
Figure 21:
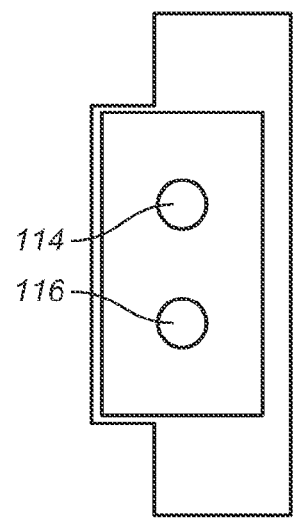
Figure 22:
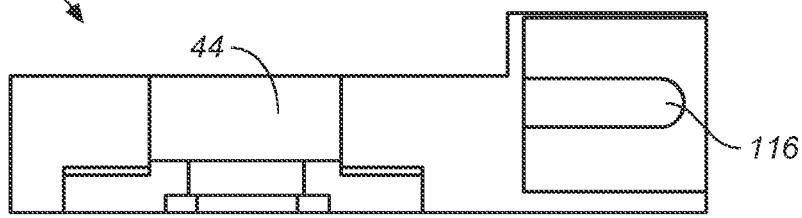

FIGS. 20-22 are different views of an LED package 112 identical to the package 106 of FIGS. 17-19 except that the terminals 114 and 116 are pins set within the package and parallel to the top surface of the package.

FIGS. 23-25 are different views of an LED package 120 that is circular. The slug 44 is molded into the package body 121 and extends from the top. The slug 44 supports a submount with LED dies (not shown). A printed circuit board or other connector (not shown) connects the submount electrodes to spade terminals 122 and 124 that extend from opposite sides of the package. The package is placed on a mounting board in alignment with a female socket for the spade terminals 122 and 124. The indents 125 are used to align the package with respect to the socket and resiliently lock the package in its final position. The package is then rotated so that the spade terminals 122 and 124 slide into the female sockets.

Figure 26:
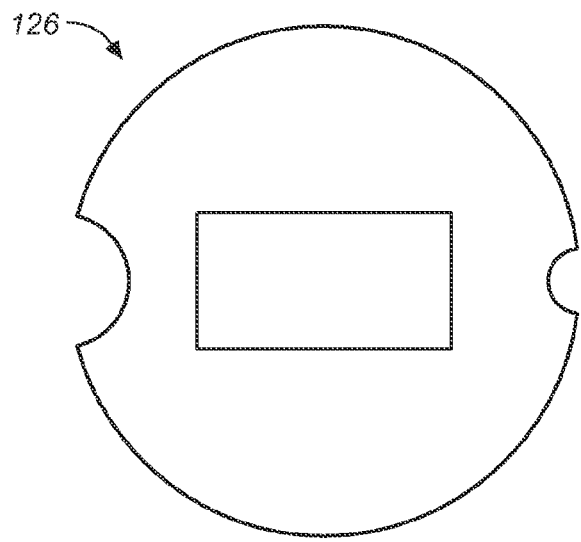
FIGS. 26, 27, and 28 are a front view, first side view, and second side view, respectively, of an LED package in accordance with a ninth embodiment of the invention.
Figure 27:
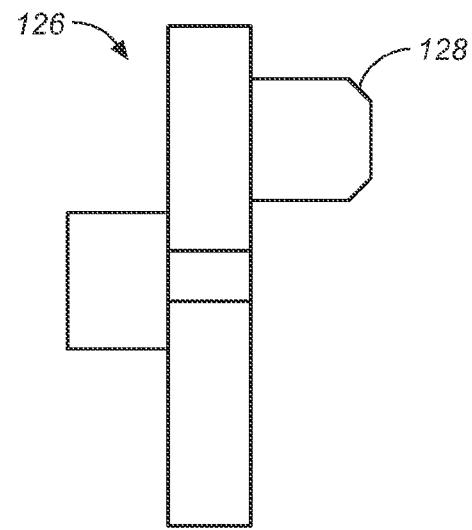
Figure 28:
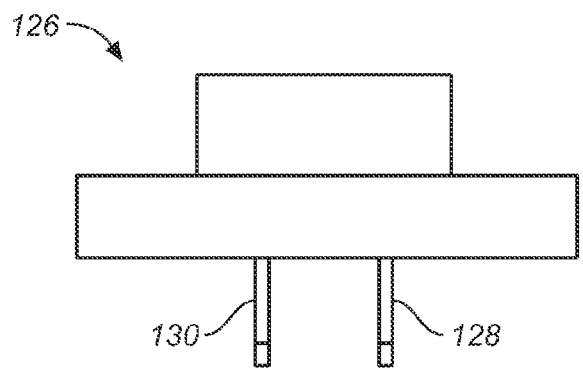

FIGS. 26-28 are different views of an LED package 126 similar to the package 120 of FIGS. 23-25 except the spade terminals 128 and 130 extend from a bottom of the package for being pushed into connectors formed in the mounting body.

Figure 29:
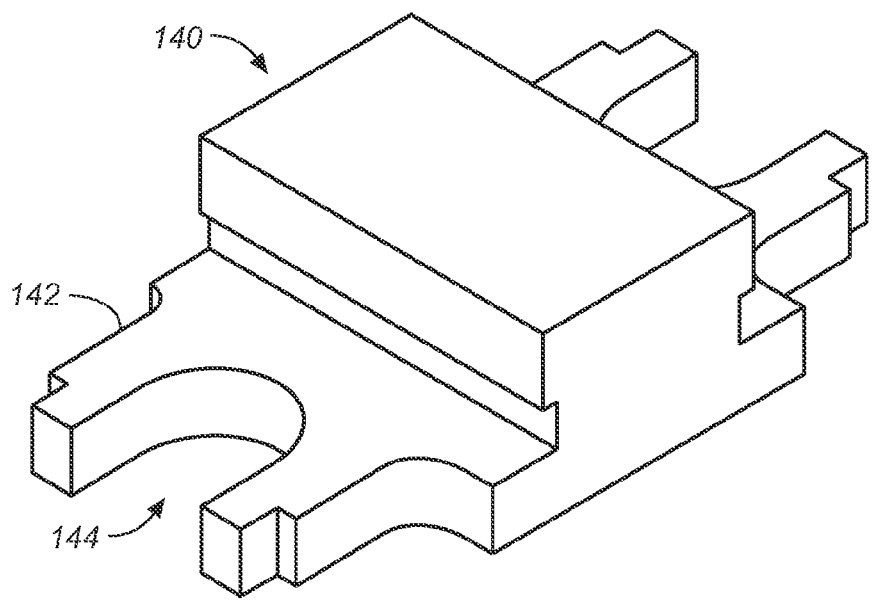
FIGS. 29 and 30 are top and bottom perspective views, respectively, of a slug that replaces the slug of FIGS. 1-28.
Figure 30:
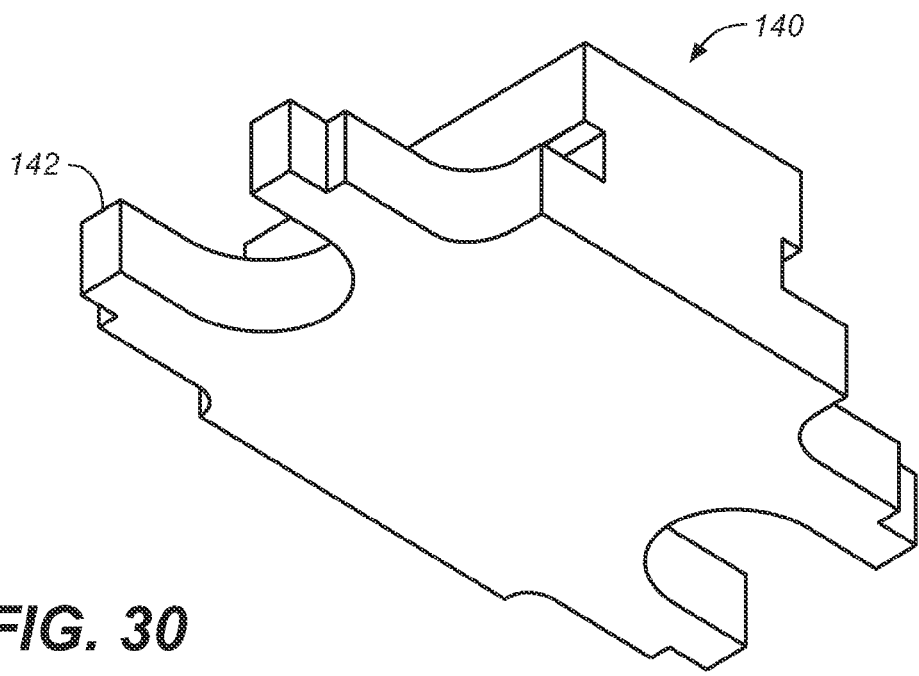

FIGS. 29 and 30 illustrate a slug 140 that can be used in place of the slug 44 in FIGS. 1-28. The slug 140 may be CuW or other highly thermally conductive metal. The slug 140 is molded into a plastic body (not shown) whose outer dimensions (known as the footprint) and fiducial holes are virtually identical to those of the body 42 in FIG. 1 so as to be a direct replacement of the package 26 of FIG. 1. The body also molds in the solderless connectors previously described. The slug 140 has extensions 142 with screw openings 144 so that downward movement of the screw head directly contacts and presses down on the extension. The entire bottom surface of the slug 140 is exposed through the plastic body to create a large thermal contact with the mounting board. The submount 30 (FIG. 1) with LEDs is mounted on the top surface of the slug 140.

Many other types of package styles may be used having molded-in standard connectors and utilizing the heat sinking designs described herein.

Figure 31:
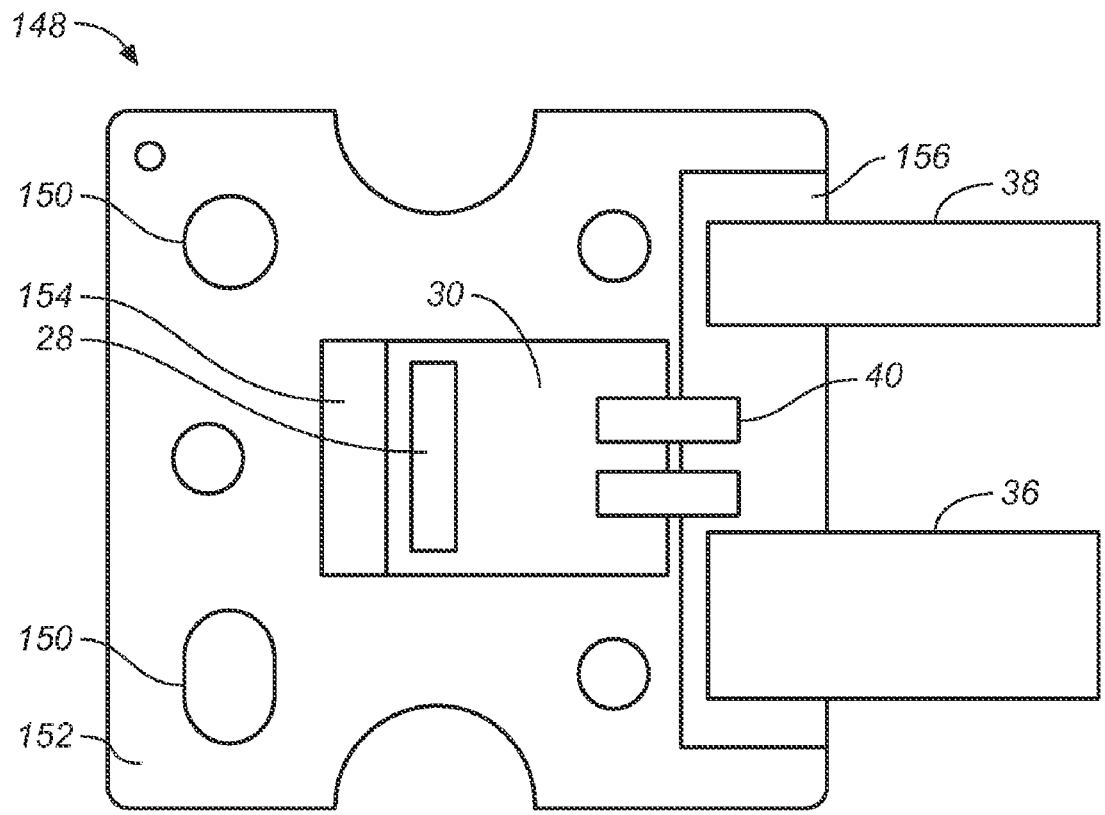
FIGS. 31 and 32 are top and side views, respectively, of an LED package where the package body is not molded plastic, but is a flat metal piece supporting the rectangular slug, a printed circuit board, and the solderless package terminals.
Figure 32:
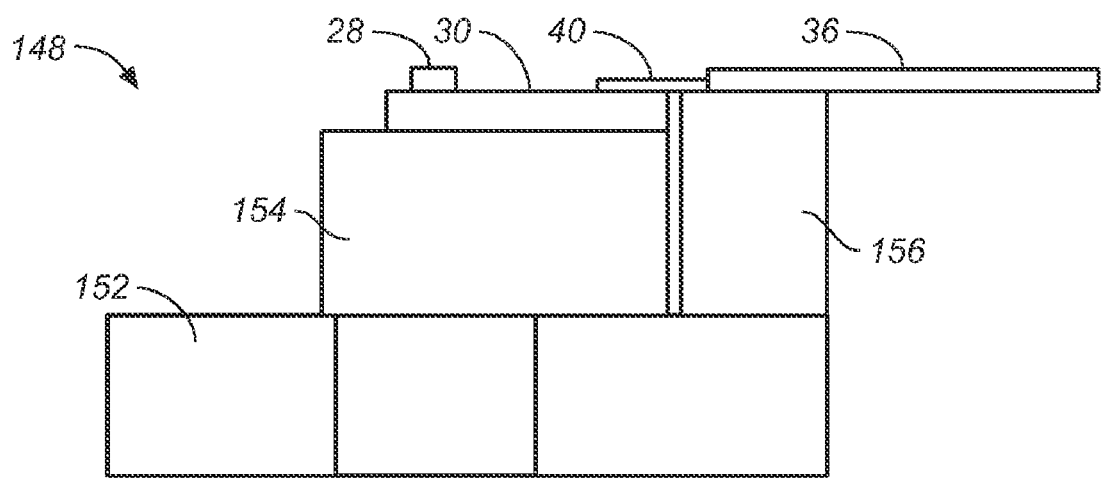

FIGS. 31 and 32 illustrate an LED package 148 that does not use a molded plastic body. FIG. 31 is a front view, and FIG. 32 is a side view. The footprint of the package 148, including the fiducial holes 150 for alignment, may be identical to the footprint of the package 26 of FIG. 1 so as to be a direct replacement. A flat metal (e.g., Cu) plate 152 has welded or brazed onto its surface a slug 154 (e.g., CuW). The submount 30 with LED dies 28 are soldered to the top surface of the slug 154. A printed circuit board (PCB) 156 is affixed to the metal plate 152. The PCB 156 has bonding pads that are bonded (thermosonically or by solder) to the ribbons 40 and spade terminals 36 and 38. This embodiment provides the highest heat sinking of any of the embodiments.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) package structure comprising:
   at least one LED die;
   a submount having electrodes, wherein the at least one LED die is mounted on the submount;
   a molded package body formed of an electrically insulating material;
   a metal slug extending through the body and molded into the body, a top and bottom surface of the slug being exposed through the body, the submount being mounted on the top surface of the slug such that the at least one LED die is electrically insulated from the slug and thermally coupled to the slug;
   solderless metal connector terminals molded into the body, the connector terminals being electrically coupled to the submount electrodes for supplying power to the at least one LED die, the connector terminals being configured for connection to a power supply without use of solder;
   clamping screw openings formed by the package structure configured to allow the body and slug to be firmly clamped to a thermally conductive mounting structure by clamping screws such that there is a thermal coupling between the bottom surface of the slug and the mounting structure, the clamping screw openings being at least along two opposite edges of the molded plastic body with the slug between the clamping screw openings; and
   metal tabs on a metal plate extending into the clamping screw openings such that a downward movement of the clamping screws presses down on the tabs to increase thermal contact between the exposed slug and the mounting structure.

2. The structure of claim 1 wherein the bottom surface of the slug extends beyond a bottom of the package body, where the bottom surface of the slug directly contacts the mounting structure when the package is clamped to the mounting structure by the clamping screws.

3. The structure of claim 1 wherein the slug and the metal plate are a single integral piece such that a downward movement of the clamping screws presses down on the tabs, directly pushing the slug against the mounting structure.

4. The structure of claim 1 wherein the slug is substantially a parallelepiped.

5. The structure of claim 1 wherein the slug has a rectangular top surface and wherein its bottom surface is larger than the top surface.

6. The structure of claim 1 wherein the top surface of the slug and a bottom surface of the submount are both rectangular.

7. The structure of claim 1 wherein a bottom surface of the submount is soldered to a top surface of the slug.

8. The structure of claim 1 wherein the connector terminals are spade terminals that extend from a side of the package body substantially parallel to a top surface of the package body.

9. The structure of claim 1 wherein the connector terminals are spade terminals that extend perpendicularly to a top surface of the package body.

10. The structure of claim 1 wherein the connector terminals are pins that extend from a side of the package body substantially parallel to a top surface of the package body.

11. The structure of claim 1 wherein the connector terminals are pins that extend perpendicularly to a top surface of the package body.

12. The structure of claim 1 wherein the connector terminals are wire clamp terminals.

13. A light emitting diode (LED) package structure comprising:
    at least one LED die;
    a submount having electrodes, wherein the at least one LED die is mounted on the submount;
    a molded package body formed of an electrically insulating material;
    a metal slug extending through the body and molded into the body, a top and bottom surface of the slug being exposed through the body, the submount being mounted on the top surface of the slug such that the at least one LED die is electrically insulated from the slug and thermally coupled to the slug;
    solderless metal connector terminals molded into the body, the connector terminals being electrically coupled to the submount electrodes for supplying power to the at least one LED die, the connector terminals being configured for connection to a power supply without use of solder; and
    a clamping structure formed by the package structure configured to allow the body and slug to be firmly clamped to a thermally conductive mounting structure such that there is a thermal coupling between the bottom surface of the slug and the mounting structure,
    wherein the package structure has fiducial holes for receiving alignment pins formed on the mounting structure.

14. The structure of claim 13 wherein the fiducial holes have different shapes to align the package structure on the mounting structure in only one orientation.

15. A light emitting diode (LED) package structure comprising:
    at least one LED die;
    a submount having electrodes, wherein the at least one LED die is mounted on the submount;
    a molded package body formed of an electrically insulating material;
    a metal slug extending through the body and molded into the body, a top and bottom surface of the slug being exposed through the body, the submount being mounted on the top surface of the slug such that the at least one LED die is electrically insulated from the slug and thermally coupled to the slug;
    solderless metal connector terminals molded into the body, the connector terminals being electrically coupled to the submount electrodes for supplying power to the at least one LED die, the connector terminals being configured for connection to a power supply without use of solder; and
    a clamping structure formed by the package structure configured to allow the body and slug to be firmly clamped to a thermally conductive mounting structure such that there is a thermal coupling between the bottom surface of the slug and the mounting structure,
    wherein the slug has tabs that extend into at least two screw openings, with the submount in-between, such that a downward movement of clamping screws presses down on the tabs, causing firm contact between the slug and the mounting structure.

16. A light emitting diode (LED) package structure comprising:
    at least one LED die;
    a submount having electrodes, wherein the at least one LED die is mounted on the submount;
    a metal slug, the submount being mounted on the top surface of the slug such that the at least one LED die is electrically insulated from the slug and thermally coupled to the slug;
    an electrically insulating support member, the metal slug being exposed through a bottom surface of the support member;
    solderless metal connector terminals affixed to the support member, the connector terminals being electrically coupled to the submount electrodes for supplying power to the at least one LED die, the connector terminals being configured for connection to a power supply without use of solder;
    clamping screw openings formed by the package structure configured to allow a bottom surface of the slug to be thermally coupled to a mounting structure, the clamping screw openings being at least along two opposite edges of the support member with the slug between the clamping screw openings; and
    metal tabs on a metal plate extending into the clamping screw openings such that a downward movement of the clamping screws presses down on the tabs to increase thermal contact between the exposed slug and the mounting structure.

17. The structure of claim 16 wherein the slug and the metal plate are a single integral piece such that a downward movement of the clamping screws presses down on the tabs, directly pushing the slug against the mounting structure.

18. The structure of claim 16, wherein the support member is a printed circuit board.

* * * * *